United States Patent [19]

Hillier et al.

[11] Patent Number: 5,221,356
[45] Date of Patent: Jun. 22, 1993

[54] APPARATUS FOR MANUFACTURING SEMICONDUCTOR WAFERS

[75] Inventors: Glen C. Hillier, Stittsville; Jurgen Becker, Nepean, both of Canada

[73] Assignee: Northern Telecom Limited, Montreal, Canada

[21] Appl. No.: 957,954

[22] Filed: Oct. 8, 1992

[51] Int. Cl.⁵ .................. C23C 16/00; B05C 13/02
[52] U.S. Cl. ................................. 118/730; 118/500; 269/903
[58] Field of Search ............... 118/730, 728, 729, 715, 118/52, 500; 269/903, 287

[56] References Cited

U.S. PATENT DOCUMENTS 5,042,423 8/1991 Wilkinson .......................... 118/500
5,077,875 1/1992 Hoke et al. ........................ 118/730

Primary Examiner—W. Gary Jones
Assistant Examiner—Steven P. Griffin
Attorney, Agent, or Firm—R. J. Austin

[57] ABSTRACT

Apparatus for semiconductor wafer manufacture in which a susceptor has an annular rotor for supporting a wafer substrate with a substrate surface facing downwards. The rotor has an annular flange overlying a body of the susceptor and the structure is such that a flow of rotor driving gas may be directed up from the body and against the flange while crystalline layers are being formed on the undersurface of the substrate.

7 Claims, 2 Drawing Sheets

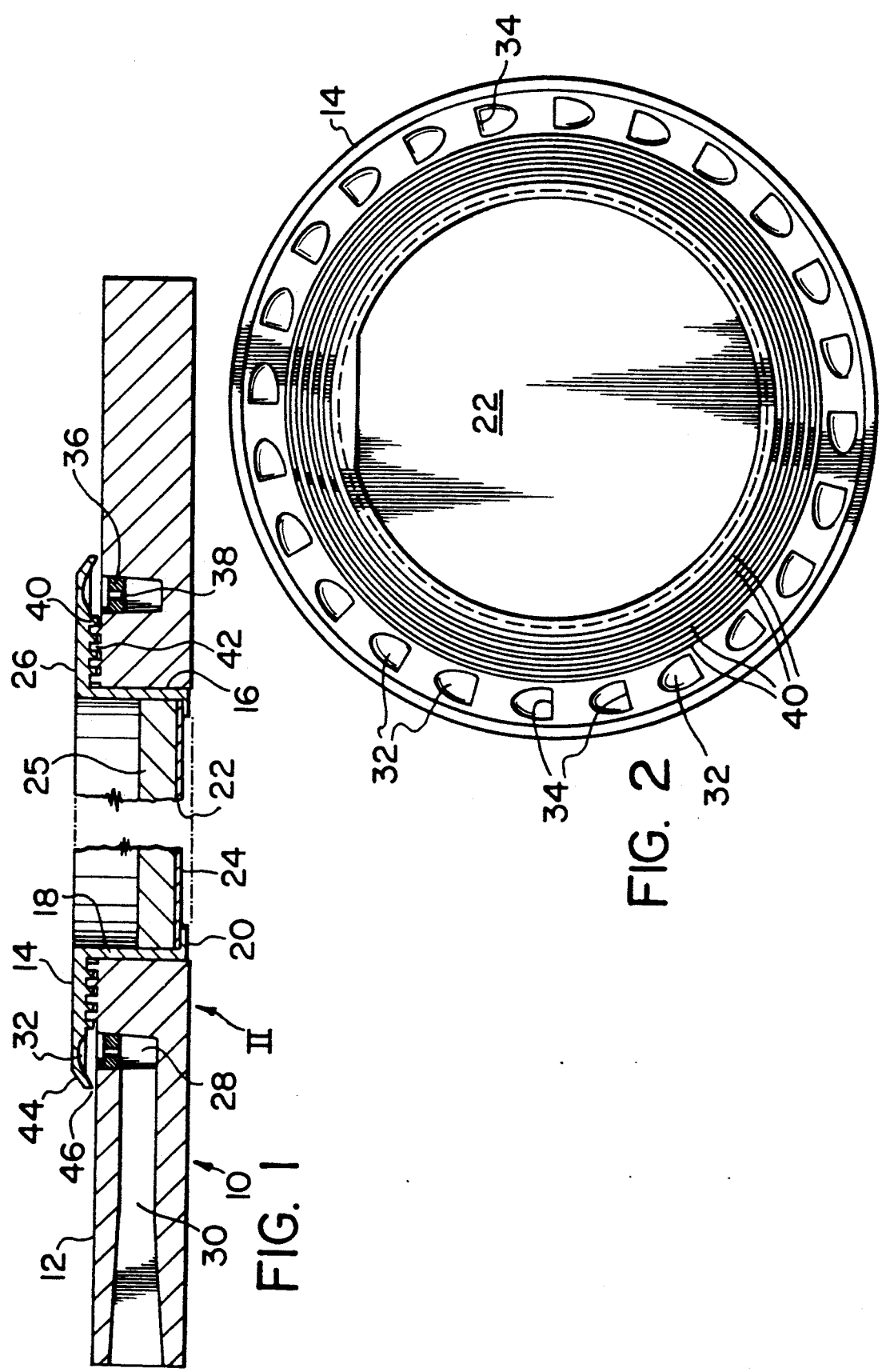

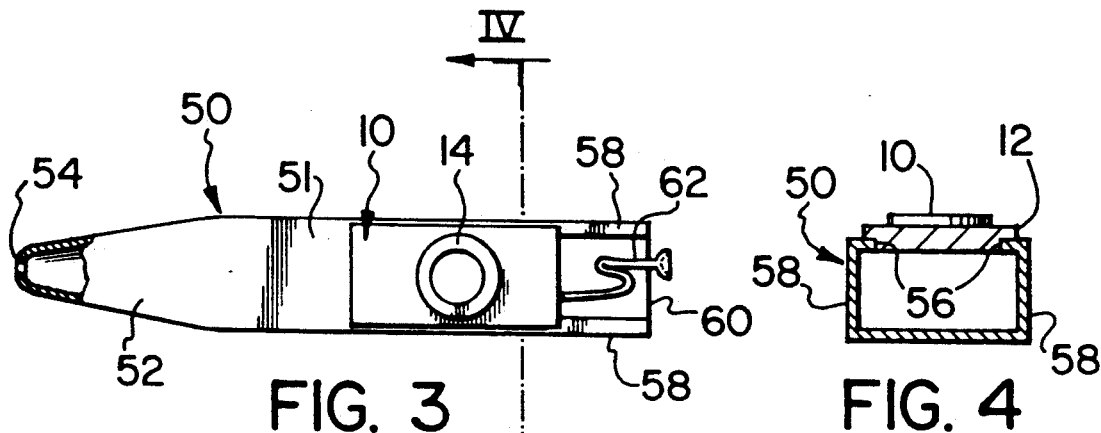
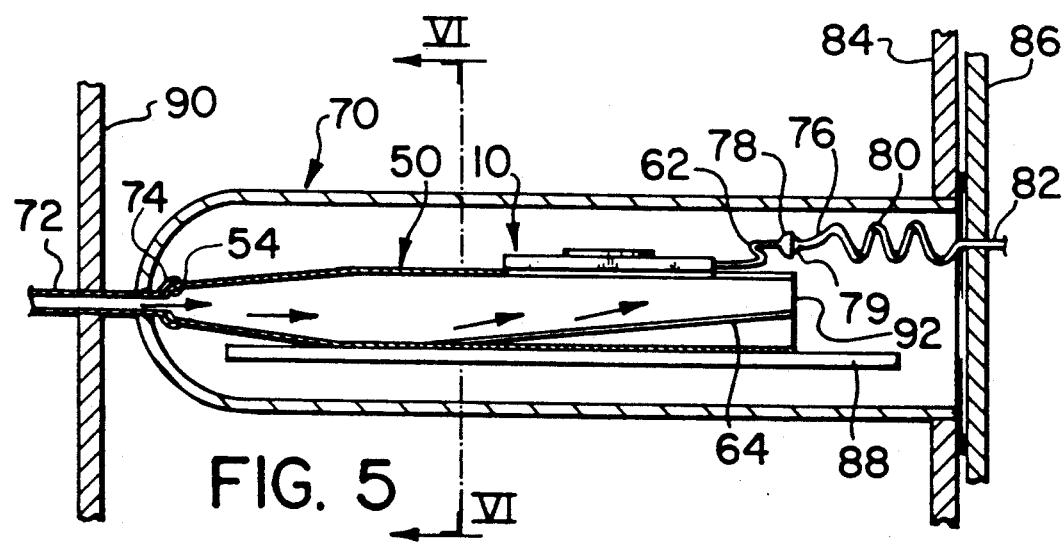
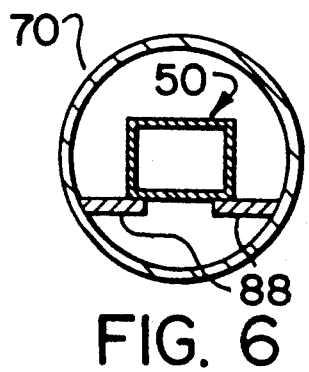

APPARATUS FOR MANUFACTURING SEMICONDUCTOR WAFERS

This invention relates to apparatus for manufacturing semiconductor wafers.

In the manufacture of semiconductor wafers for electronic or optoelectronic usage, a susceptor carries a substrate for the wafer in a reactor vessel. Gaseous reactants are caused to flow into contact with an exposed surface of the wafer and form deposits on the substrate as crystalline layers. The composition of the gaseous reactants determines the composition of the deposited layers.

In one type of apparatus, the wafer is carried by its susceptor with its exposed surface facing upwardly. The wafer is caused to rotate about a vertical axis during the deposit of the crystalline layers. Rotation is o provided in an attempt to maximize uniformity in depth and material composition of the layers. As each wafer carries many, e.g., thousands, of semiconductor devices during their manufacture by epitaxy or crystalline layer deposition, uniformity in composition and thickness of the layers is important to produce the desired characteristics in the maximum number of devices. A problem which exists, however, with this arrangement is that foreign bodies within the reactor vessel have been known to settle within the layers during deposition.

In another type of apparatus, a susceptor carries a stationary wafer which has its exposed surface facing downwardly and the gaseous reactants are caused to flow beneath the wafer and to impinge upon the exposed surface to achieve crystalline layer deposition. This provides an improvement in uniformity of composition and thickness even though the wafer is stationary and this effect is believed to be at least partly because of the manner in which the gases flow beneath the wafer.

The present invention provides an apparatus which in use seeks to improve uniformity of composition and thickness of deposition of crystalline layers upon a substrate.

Accordingly, the present invention provides an apparatus for manufacturing semiconductor wafers comprising a susceptor for carrying a substrate during gaseous deposition of crystalline layers onto a surface of the wafer, the susceptor comprising:- an annular rotor having an outwardly directed annular flange and an inwardly directed seating surface means for supporting edge regions of the substrate, the rotor defining an opening inwardly of the seating surface means; and a susceptor body having aperture means for rotatably carrying the annular rotor in a position with the seating surface means at a lower end of o the rotor and facing upwardly for supporting edge regions of the substrate while a major surface of the substrate is exposed downwardly through the opening for forming crystalline layers thereon, and with the outwardly directed flange disposed upwardly from the seating surface means and overlying the body, the body having means for directing a flow of rotor driving gas upwardly to impinge upon an underside of the flange and cause rotation of the rotor.

In use of the above apparatus according to the invention, because the wafer is caused to face downwardly, this minimizes the quantity of foreign bodies which may embed themselves into crystalline layers formed upon the wafer and also provides desirable uniformity in thickness and composition of materials in the layer.

In a preferred arrangement, the underside of the rotor flange is provided with a plurality of circumferentially spaced and radially extending impingement surfaces against which the flow of driving gas may be directed by the flow directing means at a particular angle to the axis of the rotor and cause rotor rotation. It is also to be preferred that the rotor and the susceptor body are rotatably sealable together to prevent the rotor driving gas from descending to the seating surface means, the susceptor having an outlet means for the driving gas from underneath the flange. The outlet means may be provided by orifices in the flange of the rotor. Preferably however the outlet means is provided by regions of the flange which are outward from the impingement surfaces, these outward regions being spaced from the susceptor body to form an outlet for the gas.

The invention also includes an apparatus for manufacturing semiconductor wafers comprising a susceptor and a reactor vessel, the susceptor comprising:- an annular rotor having an outwardly directed annular flange and an inwardly directed seating surface means for supporting edge regions to the substrate, the rotor defining an opening inwardly of the seating surface means; and a susceptor body having aperture means for rotatably carrying the annular rotor in a position with the seating surface means at a lower end of the rotor and facing upwardly for supporting edge regions of the substrate while a major surface of the substrate is exposed downwardly through the opening for forming crystalline layers thereon and with the outwardly directed flange disposed upwardly from the seating surface means and overlying the body, the body having means for directing a flow of rotor driving gas upwardly to impinge upon an underside of the flange and cause rotation of the rotor; and the reactor vessel having a reactant gas flow passage with an inlet and an outlet, a station for location of the susceptor with the major surface of the substrate exposed downwardly at the top of the flow passage.

In the apparatus according to the invention as defined in the last preceding paragraph, it is preferable that a first connection means is provided for connecting the inlet to a source of the reactant gas, the inlet and the first connection upon assembly forming between them a first part spherical joint, and a second connection means is provided for connecting the susceptor to a source of the rotor driving gas through a second part spherical joint upon assembly, the second connection means comprising a connecting tube formed at least partly as a compression spring. For this arrangement a means to apply end pressure upon the tube is also provided whereby upon assembly with the first and second part spherical joints formed, the pressure applying means applies pressure to the tube so that the compression spring retains each of the spherical joints assembled.

One embodiment of the invention will now be described by way of example, with reference to the accompanying drawings, in which:

FIG. 1 is a cross-sectional view through a susceptor according to the embodiment;

FIG. 2 is a view taken in the direction of arrow II in FIG. 1 and on a smaller scale onto a part of the susceptor;

FIG. 3 on a reduced scale is a plan view of a reactor vessel carrying the susceptor of the embodiment;

(FIG. 4 is a cross-sectional view taken along line IV—IV in FIG. 3 of the reactor vessel and susceptor;

FIG. 5 is a side elevational cross-sectional view of an apparatus including the reactor vessel and susceptor in use; and FIG. 6 is a cross-sectional view through the apparatus of FIG. 5 taken along line VI—VI in FIG. 5.

As shown by FIG. 1, a susceptor 10 for carrying a wafer substrate during gaseous deposition of crystalline layers onto a surface of the substrate is formed from high purity carbon and comprises a susceptor body 12 and an annular rotor 14. The susceptor body 12 has a circular aperture 16 extending between opposite major faces for receiving a cylindrical portion 18 of the annular rotor to enable the rotor to be rotated within the body. In assembled condition of the susceptor and in a position for use, an inwardly directed seating surface means of the rotor is disposed at the lower end of the cylindrical portion 18. This seating surface means comprises an annular flange 20 for supporting edge regions of a substrate 22 with a major surface of the substrate exposed in a downward direction through an opening 24 lying radially inwardly of the flange 20. A short cylindrical plug 25 fits inside the cylindrical portion 18 as shown in FIG. 1 to provide weight and heat or thermal contact to the substrate and hold it in position within the rotor-during formation of crystalline layers upon the under surface of the substrate.

At the other end of the cylindrical portion 18, the annular rotor is provided with an outwardly directed annular flange 26. This flange overlies an annular portion of the body 12 which immediately surrounds the aperture 16. The body 12 has means for directing a flow of rotor driving gas upwardly so as to impinge upon the underside of the flange and to cause rotation of the rotor. This means comprises an annular recess 28 formed in the upper surface of the body 12 and underlying edge regions of the flange 26. A flow of driving gas, i.e., nitrogen (N;), is delivered to the annular recess 28 through an entrance passage 30 extending inwards from one end of the body 12 as shown. The underside surface of the edge region of the flange 26 is formed with a plurality of spaced apart concavely surfaced shallow recesses 32 which extend around the edge region as shown by FIG. 2. The rotor is provided also with a plurality of circumferentially spaced radially extending impingement surfaces against which the flow of driving gas is to be directed. These surfaces are provided by radially extending end surfaces 34 of the recesses, the radially extending end surfaces being disposed at the same ends of the recesses so as to face circumferentially in the same direction of the rotor. The flow directing means also directs the flow of driving gas at an angle to the rotor axis so as to impinge upon the surfaces 34 thereby causing rotor rotation. This orientation of driving gas is provided by annular disk 36 which is inserted into the top of the recess 28 so as to substantially seal against the sides of the recess, the disk having a plurality of spaced apart apertures 38 which extend through the disk at an inclined angle. Hence a flow of gas passing through the recess 28 will pass through the apertures 38 in a direction inclined to the axis of the rotor and impinge upon the surfaces 34 so as to rotate the rotor in the aperture 16.

The rotor 14 and the body 12 are rotatably sealed together to prevent the driving gas after it passes through the apertures 38 from passing radially inwardly. This prevents it from passing between the aperture 16 and the cylindrical portion 18 so that the driving gas cannot move into contact and mix with the reactant gas which is to form crystalline layers on the undersurface of the substrate 22. This sealing arrangement is provided by a plurality of annular and downwardly extending ribs 40 of the flange 26, the ribs having a common centre, i.e., around the axis of rotation of the rotor, and lying in mesh with complimentary ribs 42 extending upwardly from the body 12. As the body and the rotor are both formed from high purity carbon, the meshed ribs may be substantially in intimate contact with each other and move in sliding engagement during rotor rotation.

The rotor is provided with outlet means to allow for escape of the driving gas while directing it radially outwardly away from the aperture 16. This means comprises regions of the flange 26 outwardly of the impingement surfaces 34, these regions 44 being inclined downwardly towards the body 12 while forming a narrow gap 46 together with a body 12 to allow for the escape of the driving gas after it has entered the recesses 32 and applied the driving force against the surfaces 34.

As shown by FIGS. 3 and 4, the susceptor 10 is to be mounted onto a quartz reactor vessel 50 which has a main parallel sided part 51 of generally rectangular cross-section terminating at one end in a tapered rectangular cross-sectional part 52 which has an inlet end 54 which forms the male part of a part spherical joint for connection to a source of reactant gas as will be described. As shown by FIG. 4, opposite side edges of the body 12 of the susceptor are formed with shoulders 56 which are supported upon inwardly flanged sides 58 of the reactor vessel 50, the susceptor being slidably moveable along the flanges of the sides 58 from the opposite end 60 of the vessel to the male part 54 of the spherical joint. The driving gas is introduced into the passage 30 to proceed to the annular recess 28 through a quartz inlet tube 62 extending into the passage 30. As shown by FIG. 5, the reactor vessel is provided with an upwardly inclined baffle 64 which extends beneath the location for the substrate so as to direct reactor gases proceeding through the chamber of the reactor vessel upwardly towards the substrate.

In use, the assembly of susceptor 10 and the reactor vessel 50 is carried with the reactor vessel horizontal within a cylindrically formed quartz chamber 70 provided to hold a gas pressure lower than ambient pressure. One end of the chamber is sealed to and carries an inlet tube 72 for the reactant gases, the inlet tube having an end 74 forming a female part of the spherical joint against which the male part 54 is sealably engageable to introduce the reactant gases into the reactor vessel. The other end of the chamber 70 is sealed around its edges to a bulkhead 84 with the open end of the chamber forming an outlet for the driving gas and the reactant gases to a gas collection facility (not shown). The tube 62 is connectable to an upstream quartz tube 76 also through a part spherical joint formed between part spherical mating end parts 78 and 79 on the tubes 62 and 76. The tube 76 is formed partly as a helical compression spring 80 and the upstream end 82 of the tube proceeds through the bulkhead 84 of the mounting apparatus and is mounted within a plate 86 which during assembly of the parts, is urged by a screw thread mounting (not shown) towards the bulkhead 84. The plate 86 is mountable in position by the screw threaded mounting so as to force the plate 86 towards the bulkhead 84, i.e., in the left-hand direction as shown in FIG. 5. In assembled condition, the plate 86 and bulkhead 84 are sealed together to prevent gases from escaping to outside atmosphere and to ensure that the gases flow to the gas collection facility.

To assemble the susceptor mounted upon the reactor vessel 50 into the chamber 70, the reactor vessel is slid into the chamber 70 upon quartz guiderails 88 extending inwardly from the chamber 70. The tube 72 is secured into another bulkhead 90 opposing the bulkhead 84. Thus the reactor vessel is moved along the guides 88 so that the male part 54 forms a part spherical joint with the female part 74. Subsequently, the tube 76 is introduced into the chamber 70 as the plate 86 is moved towards the bulkhead 84. Upon the plate 86 being screwed towards the bulkhead, the other part spherical joint is formed between the mating end parts 78 and 79 on the two tubes 62 and 76. Continued inwards movement of the plate 86 towards the bulkhead applies a compressive force upon the compression spring 80 of the tube 76 so that the spring 80 applies the spring force against each of the part spherical joints and holds each of the joints assembled and in sealed condition. Thus the spring 80 operates to apply a constant load horizontally to hold the two spherical joints under end pressure and provide the required seal at each joint.

During use of the apparatus described above, the reactant gases are deflected upwardly as they pass through the reactor vessel, by the baffle 64 towards the major undersurface of the substrate so as to deposit layers of crystalline material as required upon the substrate. During this procedure, pressurized driving air passes through the tube 62, into the chamber 28 and upwardly through the apertures 38 so as to drive the rotor in the body 12 of the susceptor. Because of this rotation, a desirable uniformity in thickness and composition of the layers of crystalline material is achieved across the substrate. Further to this, because the substrate faces downwardly, then there is little or no possibility of any foreign bodies adhering to the substrate surface and becoming embedded in the crystalline layers. Further, the driving gas is prevented from mixing with the reactant gases because the driving gas is directed outwards through the annular gap 46 between the rotor and the body 12 so as to be emitted outwardly from the reactor vessel whereas the reactor gases move through the reactor vessel and pass into contact with the substrate before issuing from an outlet end 92 of the reactor vessel.

In addition to the above advantages, the method of assembly of the apparatus into the chamber 70 is particularly unique and offers distinct advantages because of the ease of assembly and disassembly and the minimal time required for these operations. As may be seen from the above description, the reactor vessel is easily assembled into the chamber 70 and the joints for the flow of reactor gas and for the driving air are easily formed by simply moving the plate 86 towards the bulkhead 84 under pressure, e.g., as by a screw thread means, the spring 80 then operating continuously to apply an end force to the part spherical joints so as to maintain the sealing operation.

What is claimed is:

1. Apparatus for manufacturing semiconductor wafers comprising a susceptor for carrying a substrate during gaseous deposition of crystalline layers onto a surface of the substrate, the susceptor comprising:

an annular rotor having an outwardly directed annular flange and an inwardly directed seating surface means for supporting edge regions of the substrate, the rotor defining an opening inwardly of the seating surface means; and a susceptor body having aperture means for rotatably carrying the annular rotor in a position with the seating surface means at a lower end of the rotor and facing upwardly for supporting edge regions of the substrate while a major surface of the substrate is exposed downwardly through the opening for forming crystalline layers thereon, and with the outwardly directed flange disposed upwardly from the seating surface means and overlying the body, the body having means for directing a flow of rotor driving gas upwardly to impinge upon an underside of the flange and cause rotation of the rotor.

2. Apparatus according to claim 1 wherein the underside of the flange of the rotor is provided with a plurality of circumferentially spaced radially extending impingement surfaces and the flow directing means is formed to direct the flow of driving gas at an angle to the axis of the rotor and against the impingement surfaces to cause rotation of the rotor.

3. Apparatus according to claim 2 wherein radially inwardly of the impingement surfaces, the rotor and body are rotatably sealable together to prevent the driving gas from descending to the seating surface means, the susceptor having outlet means for allowing the driving gas to escape from underneath the flange.

4. Apparatus according to claim 3 wherein the outlet means is provided by regions of the flange outwardly of the impingement surface, said flange regions spaced from the susceptor body to form an outlet for the driving gas:

5. Apparatus for manufacturing semiconductor wafers comprising a susceptor and a reactor vessel, the susceptor comprising:

an annular rotor having an outwardly directed annular flange and an inwardly directed, seating surface means for supporting edge regions of the semiconductor wafer, the rotor defining an opening inwardly of the seating surface means; and a susceptor body having aperture means for rotatably carrying the annular rotor in a position with the seating surface means at a lower end of the rotor and facing upwardly for supporting edge regions of the semiconductor wafer while a major surface of the semiconductor wafer is exposed downwardly through the opening for forming crystalline layers thereon, and with the outwardly directed flange disposed upwardly from the seating surface means and overlying the body, the body having means for directing a flow of rotor driving gas upwardly to impinge upon an underside of the flange and cause rotation of the rotor; and the reactor vessel having a reactant gas flow passage with an inlet and an outlet, and a station for location of the susceptor with the major surface of the semiconducter wafer exposed downwardly at the top of the flow passage.

6. Apparatus according to claim 5 wherein the susceptor is provided with outlet means for allowing the driving gas to escape by directing the driving gas outwardly away from the apperture near.

7. Apparatus according to claim 5 provided with a first connection means for connecting the inlet of the reactor vessel to a source of the reactant gas, the inlet and the first connection upon assembly forming between them a first part spherical joint, and a second connection means is provided for connecting the susceptor to a source of the rotor driving gas through a second part spherical joint upon assembly, the second connection means comprising a connecting tube formed at least partly as a compression spring, means being provided to apply end pressure upon the connecting tube-whereby, upon assembly of the apparatus with the first and second part spherical joints formed, the means to apply an end pressure applies an end pressure to compress the compression spring to retain each of the first and second part spherical joints assembled.

* * * * *